US012206411B2

(12) United States Patent
Liu

(10) Patent No.: US 12,206,411 B2
(45) Date of Patent: Jan. 21, 2025

(54) POWER CHIP WITH A MULTI-FUNCTION PIN

(71) Applicant: Chengdu Monolithic Power Systems Co., Ltd., Chengdu (CN)

(72) Inventor: Pengfei Liu, Hangzhou (CN)

(73) Assignee: Chengdu Monolithic Power Systems Co., Ltd., Sichuan (CN)

( * ) Notice: Subject to any disclaimer, the term of this patent is extended or adjusted under 35 U.S.C. 154(b) by 272 days.

(21) Appl. No.: 17/969,106

(22) Filed: Oct. 19, 2022

(65) Prior Publication Data
US 2023/0130380 A1 Apr. 27, 2023

(30) Foreign Application Priority Data

Oct. 27, 2021 (CN) .......................... 202111258764.7

(51) Int. Cl.
H03K 19/177 (2020.01)
H03K 19/017 (2006.01)
H03K 19/17772 (2020.01)
H03K 19/17788 (2020.01)

(52) U.S. Cl.
CPC . *H03K 19/17788* (2013.01); *H03K 19/01742* (2013.01); *H03K 19/17772* (2013.01)

(58) Field of Classification Search
CPC ....... H03K 19/01742; H03K 19/17772; H03K 19/17788
See application file for complete search history.

(56) References Cited

U.S. PATENT DOCUMENTS

| | | | |
|---|---|---|---|
| 9,401,647 B2 * | 7/2016 | Kuang | H02M 3/33507 |
| 9,520,791 B2 * | 12/2016 | Wu | H02M 3/33507 |
| 2016/0134289 A1 * | 5/2016 | Lesea | G06F 1/26 |
| | | | 326/38 |

* cited by examiner

Primary Examiner — Kurtis R Bahr
(74) Attorney, Agent, or Firm — Perkins Coie LLP

(57) ABSTRACT

A power chip with a switching converter, having: a power pin configured to receive an input voltage, an indicating signal generating circuit configured to generate an indicating signal; a communicating circuit configured to receive/transmit communication data; and a multi-function pin configured to receive/transmit communication data and/or to provide the indicating signal under certain conditions.

20 Claims, 9 Drawing Sheets

POWER CHIP WITH A MULTI-FUNCTION PIN

CROSS-REFERENCE TO RELATED APPLICATIONS

This application claims priority to and the benefit of Chinese Patent Application No. 202111258764.7, filed on Oct. 27, 2021, which is incorporated herein by reference in its entirety.

FIELD

The present invention relates generally to electronic circuits, and more particularly but not exclusively to power integrated circuits.

BACKGROUND

With the development of the power chip technology, more and more functions are utilized with a power chip to meet different application requirements, e.g., functions to communicate with pre-stage controllers and/or post-stage loads. Usually, the power chip utilizing communication functions has at least one pin for data read-write. For a power chip, more functions require more pins, which increases the chip cost and size.

Therefore, there is a need for a power chip to minimize the number of pins to realize more functions.

SUMMARY

It is an object of the present invention to provide a power chip which realizes providing both an indicating signal and a data read-write function with one pin, to minimize chip size and cost.

In accomplishing the above and other objects, there has been provided, in accordance with an embodiment of the present invention, a power chip comprising: a power pin, configured to receive an input voltage; an indicating signal generating circuit, configured to generate an indicating signal based on working conditions of a switching converter; and a multi-function pin, configured to provide the indicating signal and to receive/transmit a communication data based on a power-on signal indicative of the input voltage, wherein the communication data includes an internal data and an external data; wherein when a power-on signal is smaller than a power-on voltage threshold, the multi-function pin has a function of receiving/transmitting the communication data through the multi-function pin; and when the power-on signal is larger than the power-on voltage threshold, based on a logic operation result of an indicator enabling signal and a communication enabling signal, the multi-function pin performs one of functions of: (1) providing the indicating signal; (2) receiving/transmitting the communication data; (3) providing the indicating signal, and receiving/transmitting the communication data.

In accomplishing the above and other objects, there has been provided, in accordance with an embodiment of the present invention, a power system comprising: a power chip, having a multi-function pin configured to provide an indicating signal and to receive/transmit a communication data based on a power-on signal indicative of an input voltage, wherein the communication data includes an internal data and an external data; a transmitting circuit, having a first terminal coupled to the multi-function pin, a second terminal coupled to a post-stage circuit, and a third terminal coupled to a receiving terminal of a host controller, wherein the transmitting circuit (1) provides the indicating signal from the multi-function pin to the post-stage circuit; (2) transmits the internal data from the multi-function pin to the host controller.

In one embodiment, the power system further comprises a receiving circuit, having a first terminal coupled to the multi-function pin and a second terminal coupled to a transmitting terminal of the host controller, wherein the receiving circuit transmits the external data from the host controller to the multi-function pin.

In accomplishing the above and other objects, there has been provided, in accordance with an embodiment of the present invention, a control method of a power chip with a multi-function pin, comprising: generating an indicating signal based on working states of a switching converter; generating a power-on signal based on a power-on signal indicative of an input voltage of the switching converter and a power-on threshold, wherein when the power-on signal is smaller than the power-on voltage threshold, the power chip has a function of receiving/transmitting a communication data through the multi-function pin; and when the power-on signal is larger than the power-on voltage threshold, based on a logic operation result of a communication enabling signal and an indicator enabling signal, the multi-function pin performs one of functions of: (1) providing the indicating signal; (2) receiving/transmitting the communication data; (3) providing the indicating signal, and receiving/transmitting the communication data.

BRIEF DESCRIPTION OF THE DRAWINGS

The present invention can be further understood with reference to the following detailed description and the appended drawings, wherein like elements are provided with like reference numerals. The drawings are only for illustration purpose. They may only show part of the devices and are not necessarily drawn to scale.

The use of the same reference label in different drawings indicates the same or like components.

DETAILED DESCRIPTION

In the present invention, numerous specific details are provided, such as examples of circuits, components, and methods, to provide a thorough understanding of embodiments of the invention. Persons of ordinary skill in the art would recognize, however, that the invention can be practiced without one or more of the specific details. In other instances, well-known details are not shown or described to avoid obscuring aspects of the invention.

Figure 1:
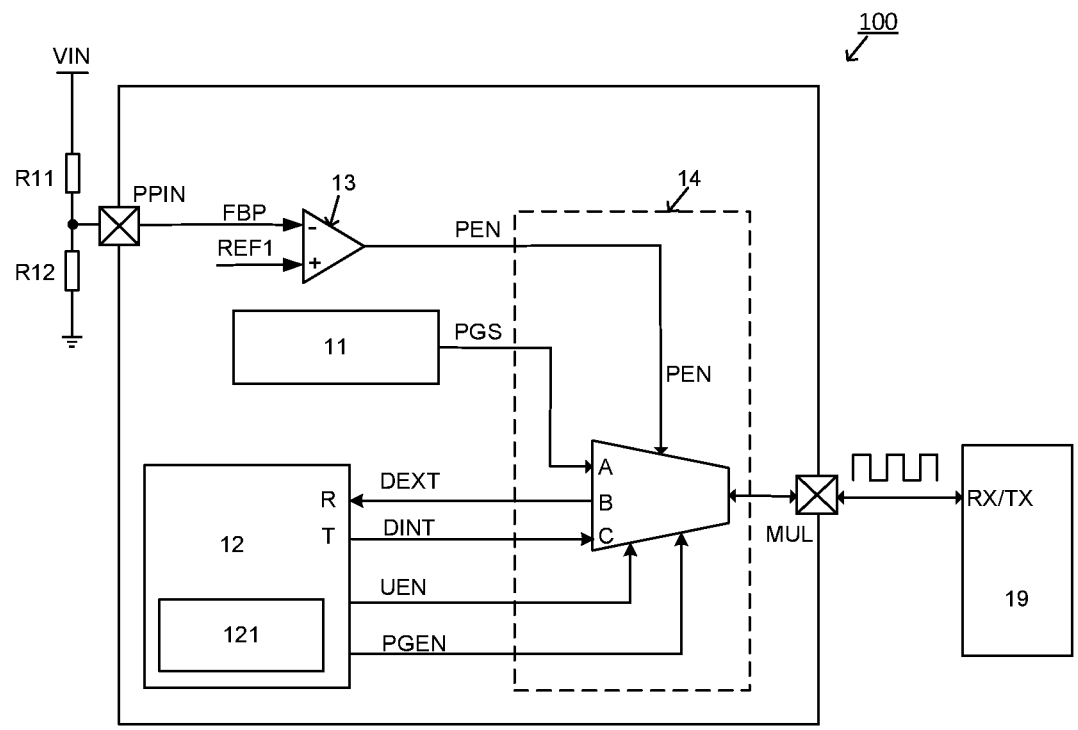
FIG. 1 schematically shows a power chip 100 in accordance with an embodiment of the present invention.

FIG. 1 shows a power chip 100 in accordance with an embodiment of the present invention. The power chip 100 comprises a power pin PPIN, an indicating signal generating circuit 11, a communicating circuit 12, a power-on detecting circuit 13, a pin control circuit 14 and a multi-function pin MUL. The power pin PPIN receives an input voltage VIN via a voltage divider comprising a first resistor R11 and a second resistor R12 as shown in FIG. 1. The input voltage VIN is provided by a switching converter, and is provided to the power chip 100 as a power-on signal FBP. The switching converter may comprise any suitable voltage converters, like a boost converter, a buck converter or a flyback converter. The power-on detecting circuit 13 receives the power-on signal FBP and a power-on voltage threshold REF1, and generates a power-on enabling signal PEN based on a comparison result of the power-on voltage threshold REF1 and the power-on enabling signal PEN. The indicating signal generating circuit 11 generates an indicating signal PGS based on working states of the switching converter. In one embodiment, when the switching converter is in a normal working condition, the indicating signal PGS is logic high; when the switching converter is in an abnormal working condition, the indicating signal PGS is logic low. The abnormal working condition includes but is not limited to conditions of over-power, over-current, over-temperature, short circuit, open circuit and other circuit faults. On the contrary, the normal working condition refers to the state that the switching converter works without the aforementioned fault. The communicating circuit 12 receives/transmits communication data DEXT and DINT through the multi-function pin MUL via the pin control circuit 14. Specifically, the communicating circuit 12 receives an external data DEXT from the multi-function pin MUL via the pin control circuit 14, transmits an internal data DINT to the multi-function pin MUL via the pin control circuit 14, and meanwhile generates an indicator enabling signal PGEN and a communication enabling signal UEN to enable/disable the data communication. The pin control circuit 14 receives the power-on enabling signal PEN, the indicator enabling signal PGEN, and the communication enabling signal UEN, the indicating signal PGS, the external data DEXT and the internal data DINT, and provides the indicating signal PGS and the internal data DINT to the multi-function pin MUL or receives the external data DEXT from the multi-function pin MUL based on the power-on enabling signal PEN, the indicator enabling signal PGEN, and the communication enabling signal UEN.

In one embodiment, when the power-on signal FBP is lower than the power-on voltage threshold REF1, the power-on enabling signal PEN is logic high, the multi-function pin MUL receives/transmits the communication data (the internal data DINT and the external data DEXT) through the multi-function pin; when the power-on signal FEP is higher than the power-on voltage threshold REF1, the power-on enabling signal PEN is logic low, based on the indicator enabling signal PGEN and the communication enabling signal UEN, the pin control circuit 14 controls the functions of multi-function pin MUL, which are: (1) providing the indicating signal PGS; (2) receiving/transmitting the communication data; (3) providing the indicating signal PGS, and receiving/transmitting the communication data. Table 1 below shows the functions of the multi-function pin MUL under the different combinations of the power-on enabling signal PEN, the indicator enabling signal PGEN and the communication enabling signal UEN in accordance with an embodiment of the present invention.

TABLE 1

| PEN | PGEN | UEN | The function of MUL |
|---|---|---|---|
| 1 | — | — | Receiving/transmitting the communication data |
| 0 | 1 | 0 | Idle |
| 0 | 0 | 0 | Providing indicating signal |
| 0 | 1 | 1 | Receiving/transmitting the communication data |
| 0 | 0 | 1 | Providing indicating signal and receiving/transmitting the communication data |

In the embodiment shown in FIG. 1, the multi-function pin MUL is coupled to a host controller 19. The host controller 19 has a transmitting terminal TX for transmitting the external data DEXT to the multi-function pin MUL and a receiving terminal RX for receiving the internal data DINT from the multi-function pin MUL. The indicator enabling signal PGEN and the communication enabling signal UEN are set by users through the host controller 19. More specifically, the external data DEXT from the host controller 19 sets the indicator enabling signal PGEN and the communication enabling signal UEN. In one embodiment, the power-on voltage threshold REF1 is also set by users through the host controller 19, which means the information of the power-on voltage threshold REF1 is included in the external data DEXT transmitted to the communicating circuit 12. In the embodiment of FIG. 1, the communicating circuit 12 further comprises a storage unit 121 for storing necessary information, like the communication data.

Figure 2A:
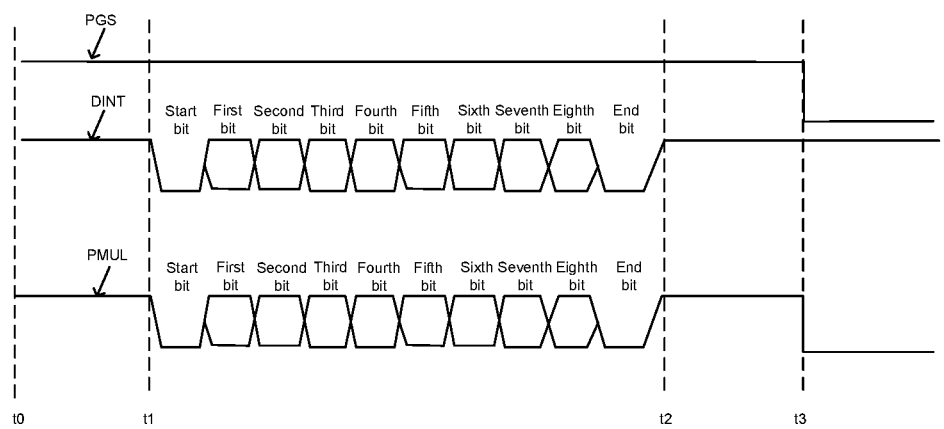
FIG. 2A schematically shows waveforms of a multi-function pin MUL of the power chip 100, when the multi-function pin MUL provides an indicating signal PGS and transmits an internal data DINT in accordance with an embodiment of the present invention.

FIG. 2A schematically shows waveforms of the multi-function pin MUL of the power chip 100 in FIG. 1, when the multi-function pin MUL provides the indicating signal PGS and transmits the internal data DINT, in accordance with an embodiment of the present invention. The signal at the multi-function pin MUL is marked as a multi-function pin signal PMUL. In the embodiment shown in FIG. 2A, when the indicating signal PGS is logic high, the switching converter is in the normal working condition. Otherwise, the switching converter is in the abnormal working condition. During time t0~t1, the indicating signal PGS is logic high and the host controller 19 is idle, the multi-function pin signal PMUL follows the indicating signal PGS. During time t1~t2, the communicating circuit 12 transmits the internal data DINT to the host controller 19 through the multi-function pin MUL, and the multi-function pin signal PMUL follows the internal data DINT. During time t2~t3, the transmission of the internal data DINT is completed, and the multi-function pin MUL provides the indicating signal PGS again. After time t3, the indicating signal PGS becomes logic low, the multi-function pin signal PMUL changes accordingly, indicating the abnormal condition of the switching converter. In the embodiment shown in FIG. 2A, the internal data DINT comprises an 8-bit word, a start bit and a stop bit. It should be known that the internal data DINT may comprise other data forms.

Figure 2B:
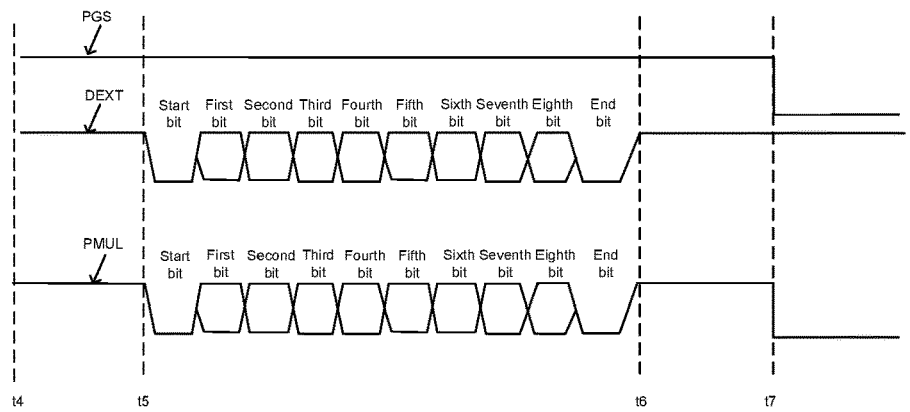
FIG. 2B schematically shows waveforms of the multi-function pin MUL of the power chip 100, when the multi-function pin MUL provides the indicating signal PGS and receives an external data DEXT in accordance with an embodiment of the present invention.

FIG. 2B schematically shows waveforms of the multi-function pin MUL of the power chip 100 in FIG. 1, when the multi-function pin MUL provides the indicating signal PGS and receives the external data DEXT, in accordance with an embodiment of the present invention. In the embodiment shown in FIG. 2B, when the indicating signal PGS is logic high, the switching converter is in a normal working condition. Otherwise, the switching converter is in the abnormal working condition. During time t4~t5, the indicating signal PGS is logic high and the host controller 19 is idle, the multi-function pin MUL follows the indicating signal PGS. During time t5~t6, the communicating circuit 12 receives the external data DEXT from the host controller 19 through the multi-function pin MUL, and the multi-function pin signal PMUL follows the external data DEXT. During time t6~t7, the transmission of external data DEXT is completed, and the multi-function pin MUL provides the indicating signal PGS. After time t7, the indicating signal PGS becomes logic low, the multi-function pin signal PMUL changes accordingly, indicating the abnormal condition of the switching converter. In the embodiment shown in FIG. 2B, the external data DEXT comprises an 8-bit word, a start bit and a stop bit. In other embodiments, the external data DEXT may comprise other data forms.

Figure 3:
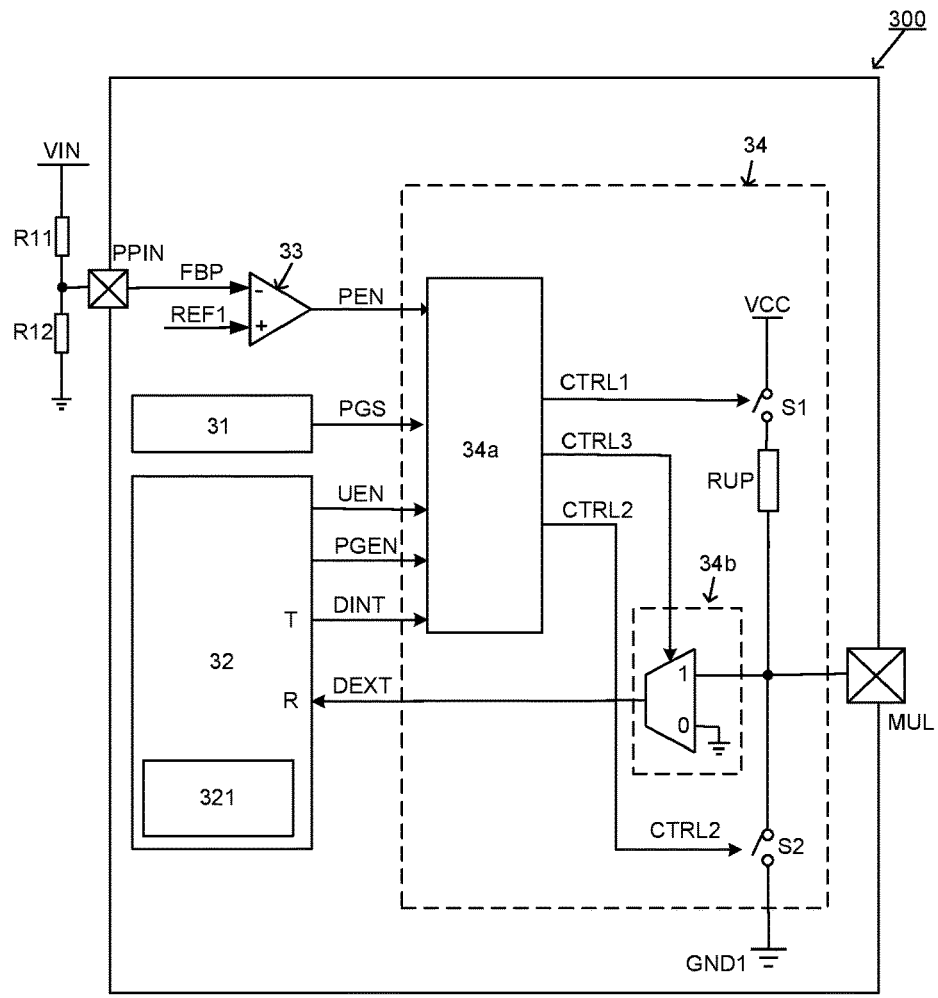
FIG. 3 schematically shows a power chip 300 in accordance with an embodiment of the present invention.

FIG. 3 schematically shows a power chip 300 in accordance with an embodiment of the present invention. The power chip 300 comprises a pin control circuit 34 which includes a digital control circuit 34a, a first switch S1, a pull-up resistor RUP, a second switch S2 and a receiving data control circuit 34b connected as shown in FIG. 3. The digital control circuit 34a receives the indicating signal PGS, the power-on enabling signal PEN, the indicator enabling signal PGEN, the communication enabling signal UEN and the internal data DINT. Based on the indicating signal PGS, the power-on enabling signal PEN, the indicator enabling signal PGEN, the communication enabling signal UEN and the internal data DINT, the digital control circuit 34a generates a first control signal CTRL1 to control the first switch S1, a second control signal CTRL2 to control the second switch S2, and a third control signal CTRL3 to control the receiving data control circuit 34b.

Figure 4:
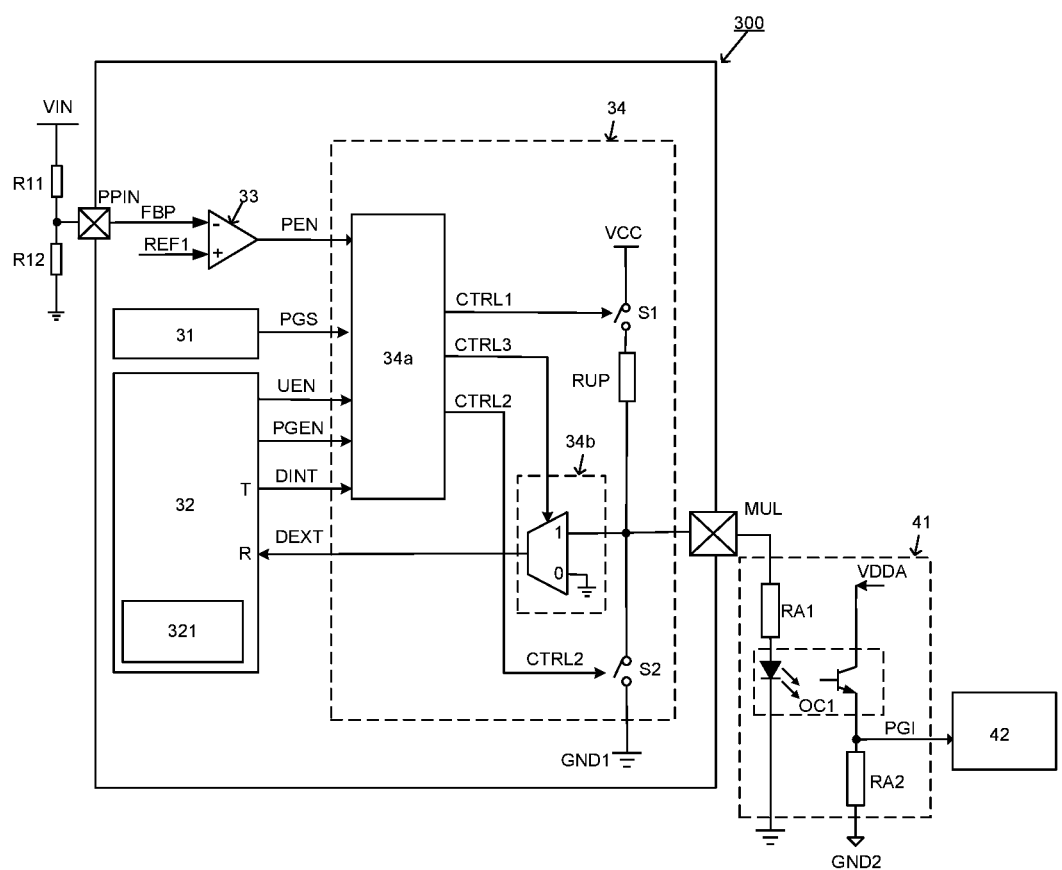
FIG. 4 schematically shows a multi-function pin MUL of the power chip 300 when the multi-function pin MUL provides the indicating signal PGS in accordance with an embodiment of the present invention.

FIG. 4 schematically shows a connection of the multi-function pin MUL of the power chip 300 to a post-stage circuit 42 with an isolation circuit 41 in-between, in accordance with an embodiment of the present invention. When the power-on enabling signal PEN is logic low, by additionally setting the indicator enabling signal PGEN and the communication enabling signal UEN to logic low, the multi-function pin MUL performs the function (1) providing the indicating signal PGS. In this case, as mentioned before, the first switch S1 is turned on/off by the first control signal CTRL1 to restore the indicating signal PGS at the multi-function pin MUL, the second switch S2 keeps off by the second control signal CTRL2, and the communicating circuit 32 disconnects the communication circuit 32 from the multi-function pin MUL by the third control signal CTRL3, that is, the receiving data control circuit 34b is coupled to a power chip reference ground GND1.

In the embodiment shown in FIG. 4, the indicating signal PGS is provided to the post-stage circuit 42 through an isolation circuit 41. The post-stage may be a fault indicating signal, that receives the indicating signal PGS to instruct a fault condition to be further processed by a fault processing circuit. The isolation circuit 41 comprises a first isolation resistor RA1, an isolation optocoupler OC1 and a second isolation resistor RA2. The first isolation resistor RA1 has a first terminal and a second terminal, wherein the first terminal is coupled to the multi-function pin MUL. The isolation optocoupler OC1 comprises a light-emitting diode (LED) and a photosensitive triode, wherein the LED is coupled between the second terminal of the first isolation resistor RA1 and the power chip reference ground GND1. The photosensitive triode has a collector, an emitter and a base, wherein the collector of the photosensitive triode is coupled to a power supply VDDA, and the emitter of the photosensitive triode provides an amplified signal PGI to the post-stage circuit 42. The second isolation resistor RA2 is coupled between the emitter of photosensitive triode and a post stage reference ground GND2.

Figure 5A:
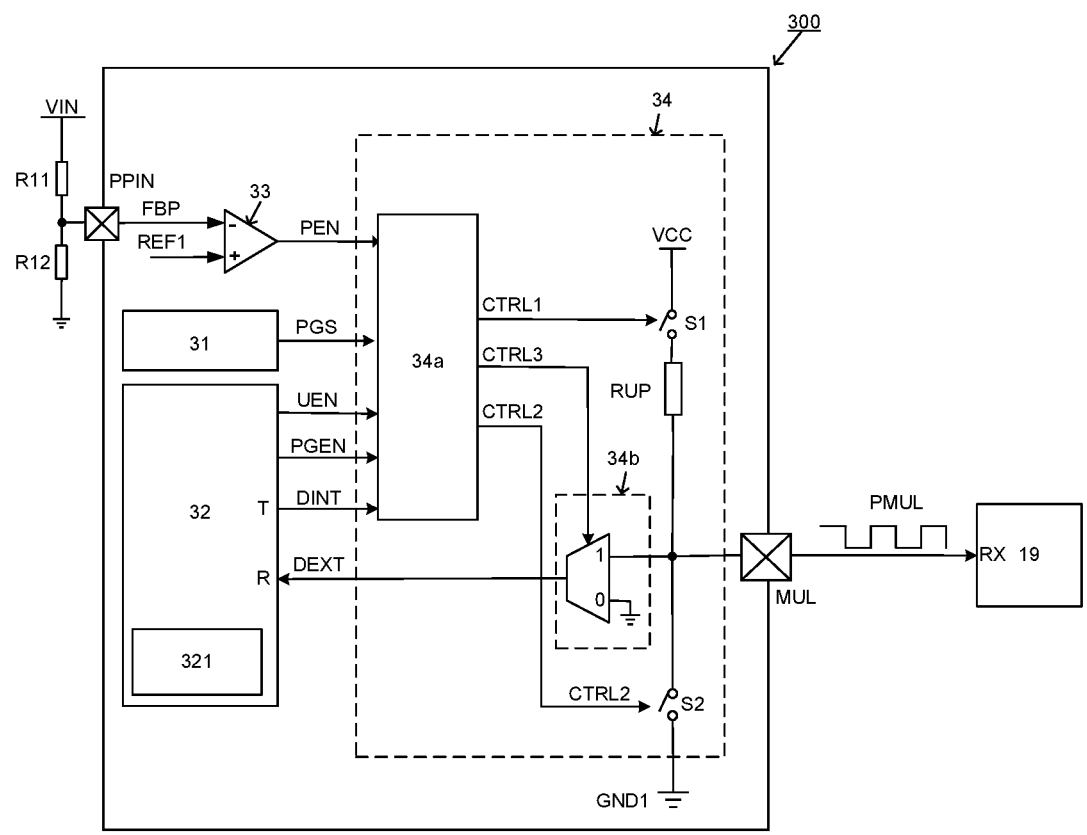
FIG. 5A schematically shows the multi-function pin MUL of the power chip 300 when the multi-function pin MUL transmits the internal data DINT in accordance with an embodiment of the present invention.
Figure 5B:
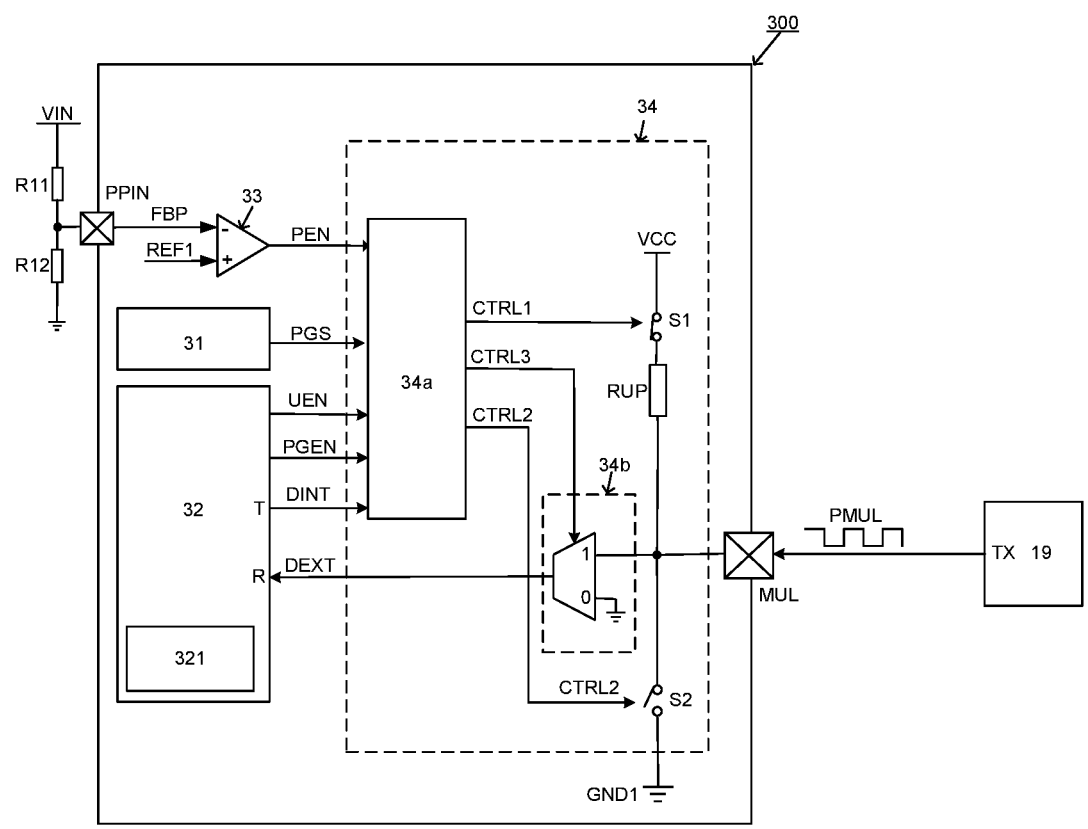
FIG. 5B schematically shows the multi-function pin MUL of the power chip 300 when the multi-function pin MUL receives the external data DEXT in accordance with an embodiment of the present invention.

FIGS. 5A and 5B show a connection of the multi-function pin MUL of the power chip 300 to the host controller 19 in accordance with an embodiment of the present invention. In the embodiments shown in FIG. 5A and FIG. 5B, by setting the indicator enabling signal PGEN and the communication enabling signal UEN to particular logic states, i.e., logic high as shown in Table 1, the multi-function pin MUL performs the function (2) receiving/transmitting the communication data. In this case, the first switch S1 keeps on by the control of the first control signal CTRL1, the second switch S2 is turned on/off by the second control signal CTRL2 to restore the internal data DINT at the multi-function pin MUL, and the receiving data control circuit 34b connects the receiving terminal R of the communicating circuit 32 to the multi-function pin MUL to receive the external data DEXT, i.e., the signal at the multi-function pin MUL is passing through the data control circuit 34b. Specifically, FIG. 5A shows the state when the internal data DINT is transmitted to the host controller 19 from the communicating circuit 32 via the second switch S2, and FIG. 5B shows the state when the external data DEXT is transmitted from the host controller 19 to the communicating circuit 32 via the data control circuit 34b.

Figure 6A:
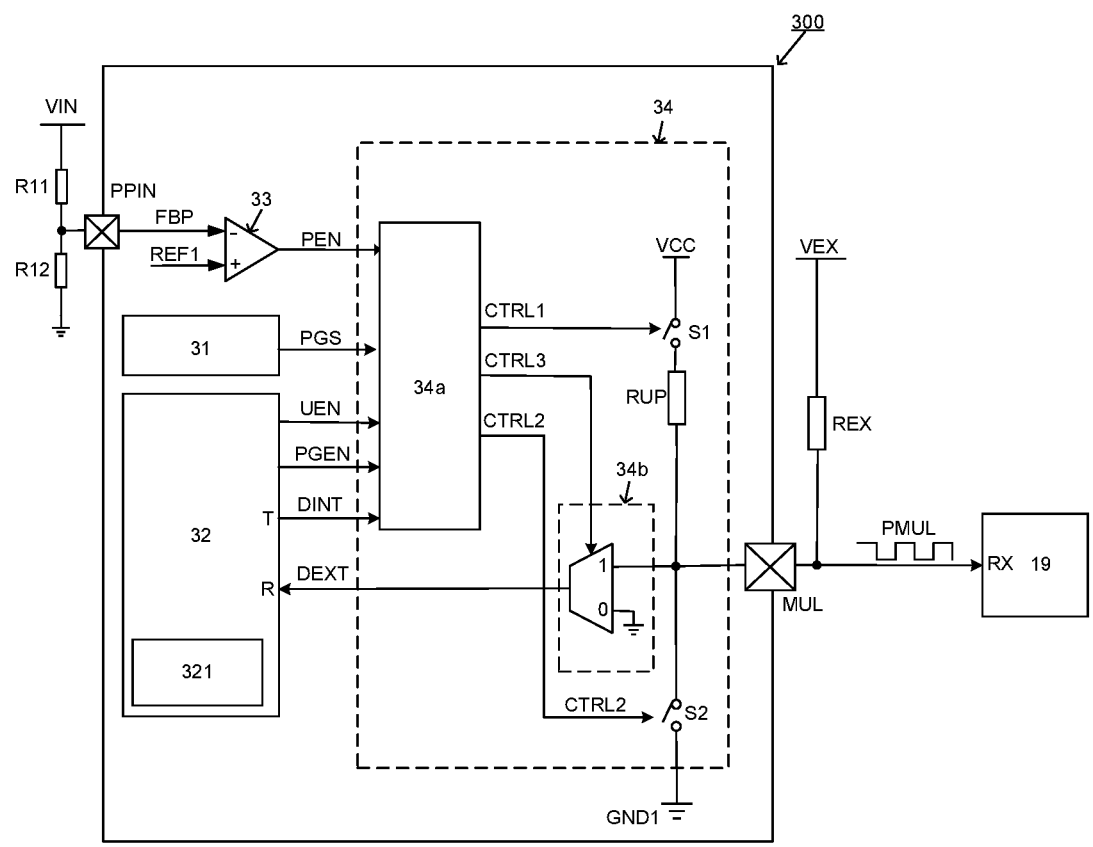
FIG. 6A schematically shows the multi-function pin MUL of a power chip 300 when the multi-function pin MUL is coupled to a regulating resistor REX and transmits the internal data DINT in accordance with an embodiment of the present invention.
Figure 6B:
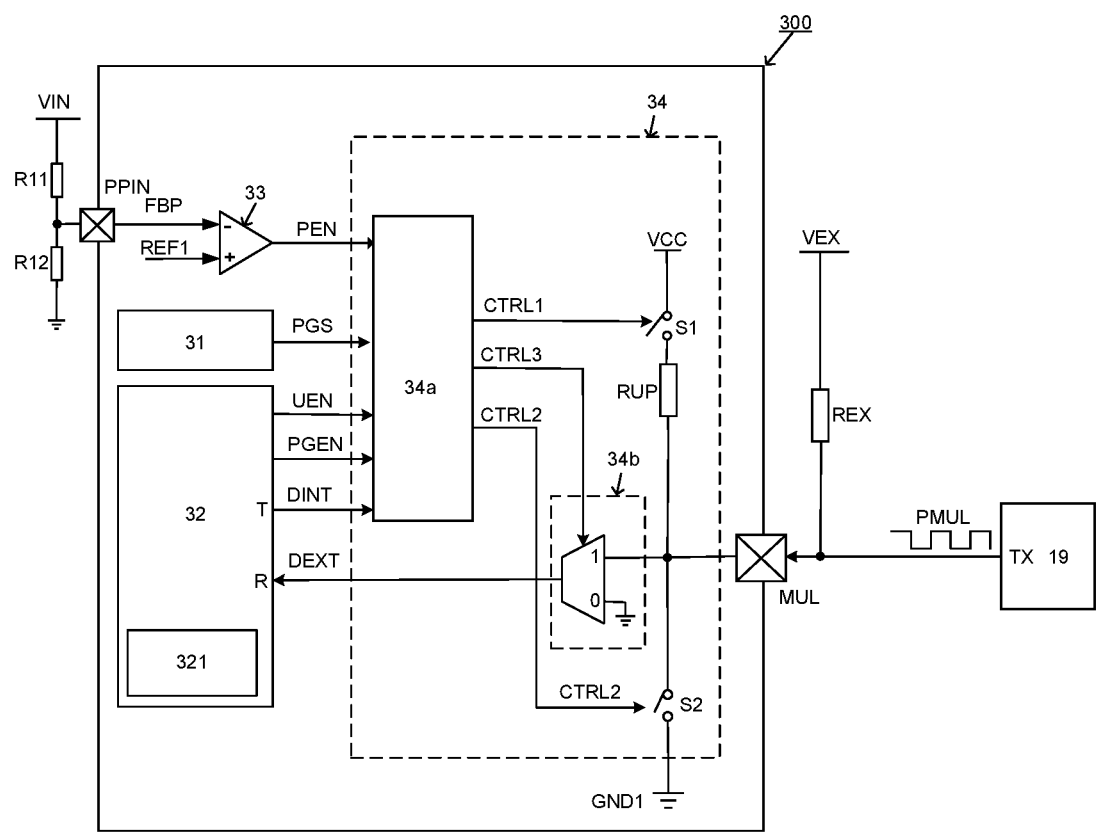
FIG. 6B schematically shows the multi-function pin MUL of the power chip 300 when the multi-function pin MUL is coupled to the regulating resistor REX and receives the external data DEXT in accordance with an embodiment of the present invention.

FIGS. 6A and 6B show a connection of the multi-function pin MUL of the power chip 300 to the host controller 19 in accordance with an embodiment of the present invention. Compared with the embodiments in FIGS. 5A and 5B, a regulating resistor REX is coupled between a power supply VEX and the multi-function pin MUL. The regulating resistor REX is configured by the users to replace the pull-up resistor RUP inside the power chip 300, which means that the first switch S1 is turned off to disconnect the pull-up resistor RUP in the embodiments of FIGS. 6A and 6B. The working principle of the examples in FIGS. 6A and 6B is similar with that in FIGS. 5A and 5B, and is not described here for brevity.

Figure 7:
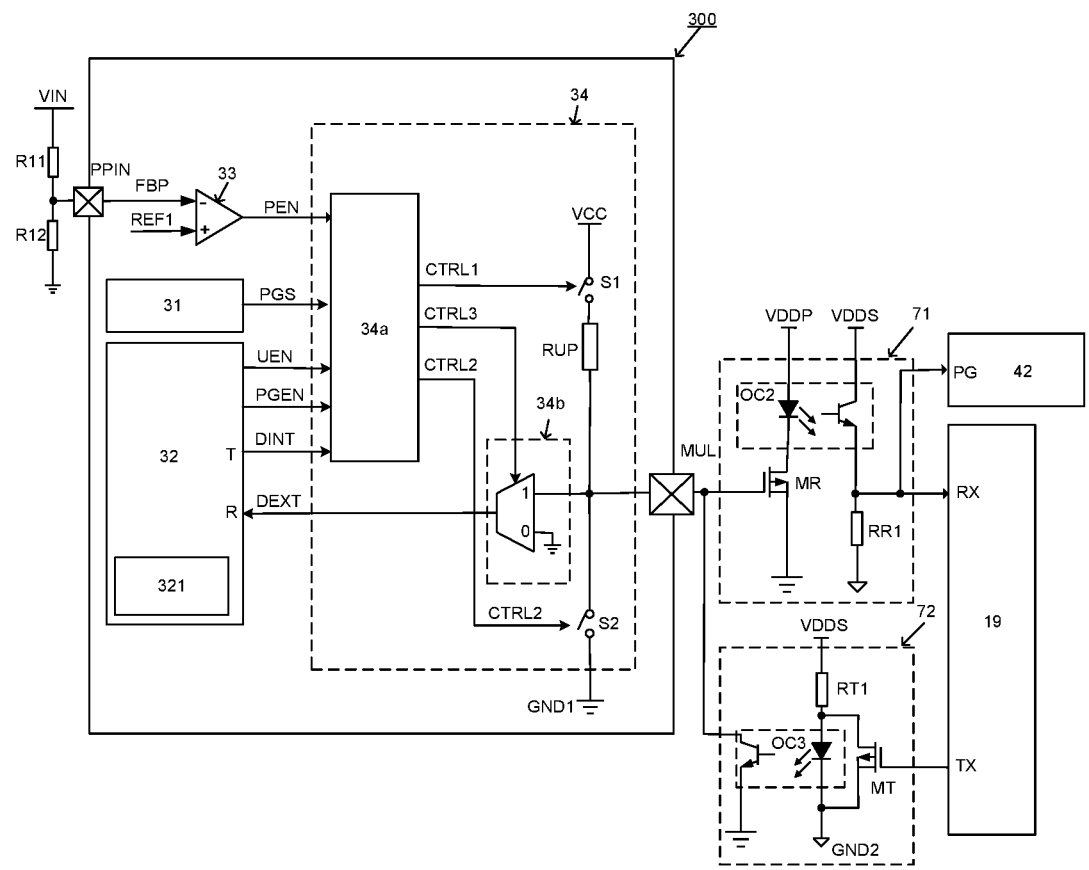
FIG. 7 schematically shows the multi-function pin MUL of the power chip 300 when the multi-function pin MUL provides the indicating signal PGS, transmits the internal data DINT and receives the external data DEXT in accordance with an embodiment of the present invention.

FIG. 7 schematically shows a connection of the multi-function pin MUL of the power chip 300 to the post-stage circuit 42 with a transmitting circuit 71 in-between, and a connection between the multi-function pin MUL of the power chip 300 to the host controller 19 with a receiving circuit 72 in-between, in accordance with an embodiment of the present invention. When the power-on enabling signal PEN is logic low, by setting the indicator enabling signal PGEN and the communication enabling signal UEN to particular logic states, e.g., PGEN=0 and UEN=1 as indicated by the Table 1, the multi-function pin MUL performs the function (3): providing the indicating signal PGS, and receiving/transmitting the communication data. Through the transmitting circuit 71, the indicating signal PGS is provided to the post-stage circuit 42, and the internal data DINT is provided to the host controller 19. Through the receiving circuit 72, the external data DEXT is transmitted from the transmitting terminal TX of the host controller 19 to the power chip 300. The transmitting circuit 71 comprises a transmitting switch MR, a transmitting optocoupler OC2 and a transmitting resistor RR1. The transmitting switch MR has a control terminal, a first terminal and a second terminal, wherein the control terminal is coupled to the multi-function pin MUL, and the second terminal is coupled to the power chip reference ground GND1. The transmitting optocoupler OC2 comprises an LED and a photosensitive triode. The anode of the LED is coupled to a transmitting side power supply VDDP, and the cathode of the LED is coupled to the first terminal of the transmitting switch MR. The photosensitive triode has a collector, an emitter and a base, wherein the collector is coupled to a receiving side power supply VDDS and the emitter provides the indicating signal PGS or transmits the internal data DINT. The transmitting resistor RR1 comprises a first terminal and a second terminal, wherein the first terminal is coupled to the emitter of the photosensitive triode, the receiving terminal RX of the host controller 19 and the indicating terminal PG of the post-stage circuit, and the second terminal is coupled to the post stage reference ground GND2. The receiving circuit 72 comprises a receiving switch MT, a receiving resistor RT1 and a receiving optocoupler OC3. The receiving switch MT has a control terminal, a first terminal and a second terminal, wherein the control terminal is coupled to the transmitting terminal TX of the host controller 19, and the second terminal is coupled to the post stage reference ground GND2. The first resistor RT1 is coupled between the first terminal of the receiving switch MT and the receiving side power supply VDDS. The receiving optocoupler OC3 comprises an LED and a photosensitive triode, wherein the LED is coupled between the first and second terminal of the switch MT. The photosensitive triode has a collector, an emitter and a gate wherein the emitter is coupled to the power chip reference ground GND1 and the collector is coupled to the multi-function pin MUL.

In the embodiment of FIG. 7, the first switch S1 keeps on by the control of the first control signal CTRL1, the second switch S2 is turned on/off by the second control signal CTRL2 to restore the internal data DINT at the multi-function pin MUL, and the receiving data control circuit 34b connects the receiving terminal R of the communicating circuit 32 to the multi-function pin MUL to receive the external data DEXT, i.e., the signal at the multi-function pin MUL is passing through the data control circuit 34b. The internal data DINT is provided by turning on/off the second switch S2, and the external data DEXT is received through the data control circuit 34b. When the indicating signal PGS indicates the abnormal working condition, the second switch S2 is turned on to pull down the multi-function pin MUL, so as to provide a logic low signal to the post stage circuit 42 with the first priority, which means if data communication is going on, it is interrupted. The signal at the multi-function pin MUL is determined to be the internal data DINT or the indicating signal PGS by frequency.

Figure 8:
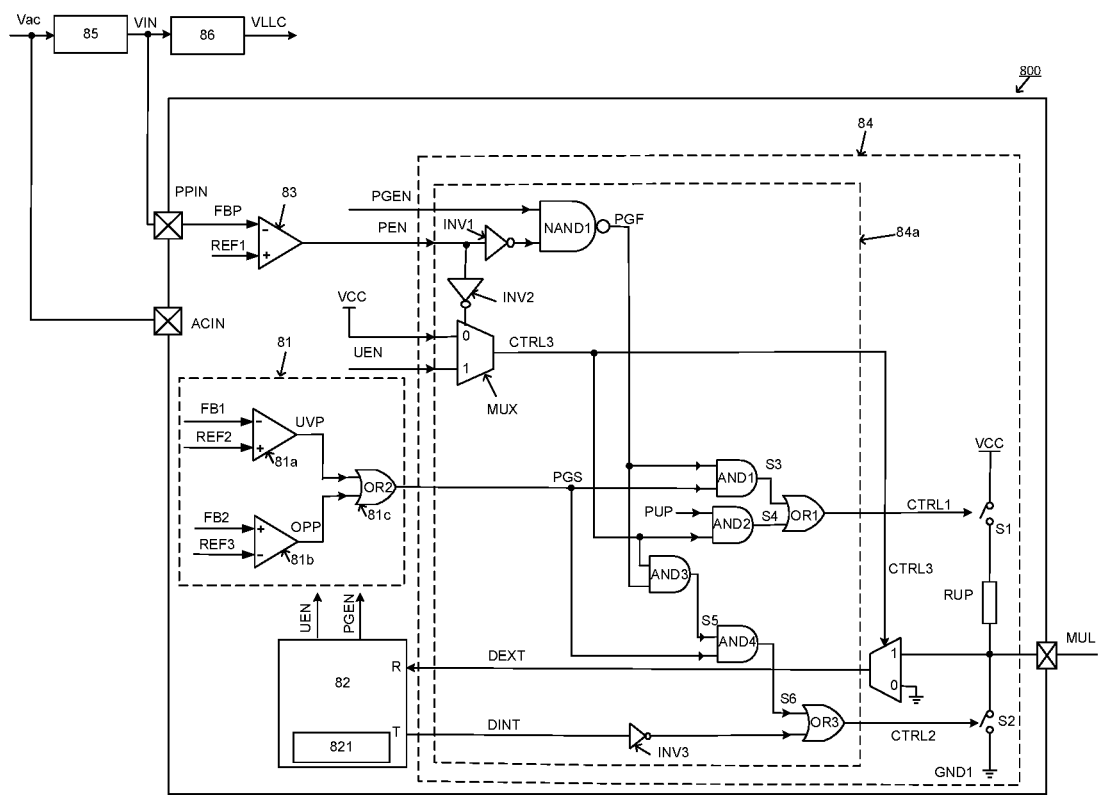
FIG. 8 schematically shows a power chip 800 in accordance with an embodiment of the present invention.

FIG. 8 shows a power chip 800 in accordance with an embodiment of the present invention. In the embodiment of FIG. 8, the switching converters, i.e., a PFC (Power Factor Correction) circuit 85 and the resonance conversion circuit 86 provides the input voltage VIN and a load voltage VLLC respectively. Specifically, the PFC circuit 85 receives an AC voltage Vac and generates the input voltage VIN based on the AC voltage Vac. The resonance conversion circuit 86 receives the input voltage VIN and generates the load voltage VLLC based on the input voltage VIN. The power chip 800 receives a rectified voltage of the AC voltage Vac through an AC voltage pin ACIN and receives the input voltage VIN through the power pin PPIN. In FIG. 8, the power chip 800 comprises the indicating signal generating circuit 81, which includes an under-voltage detecting circuit 81a, an over-power detecting circuit 81b, and a logic circuit 81c. The under-voltage detecting circuit 81a receives a correction feedback signal FB1 indicative of the rectified voltage of the AC voltage Vac and an under-voltage threshold REF2, and generates an under-voltage signal UVP based on a comparison result of the correction feedback signal FB1 and the under-voltage threshold REF2. The over-power detecting circuit 81b receives an input feedback signal FB2 indicative of the input voltage VIN and an over-voltage threshold REF3, and generates an over-power signal OPP based on a comparison result of the input feedback signal FB2 and the over-voltage threshold REF3. The logic circuit 81c receives the under-voltage signal UVP and the over-power signal OPP, and generates the indicating signal PGS based thereon. In the embodiment of FIG. 8, when the correction feedback signal FB1 is lower than the under-voltage threshold REF2, the indicating signal PGS is logic high, indicating an under-voltage condition. When the resonant feedback signal FB2 is higher than the over-voltage threshold REF3, the indicating signal PGS is logic high, indicating an over-power condition. In one embodiment, the under-voltage threshold REF2 and the over-voltage threshold REF3 are set by the host controller 19. More specifically, the information of the under-voltage threshold REF2 and the over-voltage threshold REF3 is included in the external data DEXT transmitted to the communicating circuit 82. Persons of ordinary skill in the art should know that the under-voltage detecting circuit 81a and the over-power detecting circuit 81b are just for illustrating, and may be realized by any known circuit performing the similar function. It should be understood that, the indicating signal PGS is for indicating the abnormal condition of the switching converters 85 and 86 in the embodiment of FIG. 8, thus may be generated based on other fault indicating signals of the switching converters.

As shown in FIG. 8, the PFC circuit 85 and the resonance conversion circuit 86 are independent from the power chip 800. It should be understood that the switching converter, like the PFC circuit 85 and the resonance conversion circuit 86 may be integrated into the power chip 800 in other embodiments.

Continuing the illustration of FIG. 8, the power chip 800 comprises a pin control circuit 84. The pin control circuit 84 is coupled to the power-on detecting circuit 83, the indicating signal generating circuit 81, the communicating circuit 82 and the multi-function pin MUL. The pin control circuit 84 further comprises a digital control circuit 84a. The digital control circuit 84a comprises a first inverter INV1, a second inverter INV2, a third inverter INV3, an NAND gate NAND1, a selector MUX, a first AND gate AND1, a second AND gate AND2, a third AND gate AND3, a fourth AND gate AND4, a first OR gate OR1 and a third OR gate OR3. The NAND gate NAND1 has a first input terminal configured to receive the indicator enabling signal PGEN, a second input terminal configured to receive an inverted signal of the power-on enabling signal PEN, and an output terminal configured to provide a first logic signal PGF. The selector MUX1 has a first input terminal configured to receive the logic power supply VCC, a second input terminal configured to receive the communication enabling signal UEN, a control terminal configured to receive an inverted signal of the power-on enabling signal PEN, and an output terminal configured to provide the third control signal CTRL3. The third control signal CTRL3 is either logic high or equal to the communication enabling signal UEN under the control the power-on enabling signal PEN. The first AND gate AND1 has a first input terminal configured to receive the first logic signal PGF, a second input terminal configured to receive the indicating signal PGS, and an output terminal configured to provide a third logic signal S3. The second AND gate AND2 has a first input terminal configured to receive an off-chip resistor indicating signal PUP, a second input terminal configured to receive the third control signal CTRL3, and an output terminal configured to provide a fourth logic signal S4. The first OR gate OR1 has a first input terminal configured to receive the third logic signal S3, a second input terminal configured to receive the fourth logic signal S4, and an output terminal configured to provide the first control signal CTRL1. The third AND gate AND3 has a first input terminal configured to receive the third control signal CTRL3, a second input terminal configured to receive the first logic signal PGF, and an output terminal configured to provide a fifth logic signal S5. The fourth AND gate AND4 has a first input terminal configured to receive the fifth logic signal S5 and a second input terminal configured to receive the indicating signal PGS, and an output terminal configured to provide a sixth logic signal S6. The third OR gate OR3 has a first input terminal configured to receive the sixth logic signal S6, a second input terminal configured to receive an inverted signal of the internal data DINT, and a transmitting terminal configured to provide the second control signal CTRL2.

In the embodiment of FIG. 8, when there is an off-chip resistor coupled to the multi-function pin MUL, like the regulating resistor REX in FIGS. 6A and 6B, the off-chip resistor indicating signal PUP is logic low to turn off the first switch S1.

Persons of ordinary skill in the art should know that the digital circuit 83a is an example for illustration. Any digital control circuits which could achieve the above control functions are applicable to the present invention.

In the present invention, the multi-function pin MUL of the power chip is configured as the data communication pin and meanwhile provides the indicating signal PGS, which minimizes the size and cost of the power chip.

While specific embodiments of the present invention have been provided, it is to be understood that these embodiments are for illustration purposes and not limiting. Since the invention can be practiced in various forms without distracting the spirit or the substance of the invention, it should be understood that the above embodiments are not confined to any aforementioned specific detail, but should be explanatory broadly within the spirit and scope limited by the appended claims. Thus, all the variations and modification falling into the scope of the claims and their equivalents should be covered by the appended claims.

What is claimed is:

1. A power chip, comprising:
    a power pin, configured to receive an input voltage;
    an indicating signal generating circuit, configured to generate an indicating signal based on working conditions of a switching converter; and
    a multi-function pin, configured to provide the indicating signal and to receive/transmit a communication data based on a power-on signal indicative of the input voltage, wherein the communication data includes an internal data and an external data; wherein
    when the power-on signal is larger than the power-on voltage threshold, based on a logic operation result of an indicator enabling signal and a communication enabling signal, the multi-function pin performs one of functions of: (1) providing the indicating signal; (2) receiving/transmitting the communication data; (3) providing the indicating signal, and receiving/transmitting the communication data.

2. The power chip of claim 1, the multi-function pin has a function of receiving/transmitting the communication data through the multi-function pin when a power-on signal is smaller than a power-on voltage threshold.

3. The power chip of claim 1, further comprising a communicating circuit for receiving the external data from the multi-function pin, and for transmitting the internal data to the multi-function pin.

4. The power chip of claim 3, wherein the communicating circuit comprises a storage unit for storing the communication data.

5. The power chip of claim 1, further comprising:
    a first switch;
    a pull-up resistor, coupled in series with the first switch between a logic power supply and the multi-function pin;
    a second switch, coupled between the multi-function pin and a power chip reference ground; and
    a receiving data control circuit, coupled between the multi-function and a receiving terminal of the communicating circuit.

6. The power chip of claim 5, wherein during when the first switch is turned on and off based on the indicating signal, the second switch keeps off, and the receiving data control circuit disconnects the multi-function pin and the receiving terminal of the communicating circuit, the indicating signal is provided to the multi-function pin through the first switch.

7. The power chip of claim 5, wherein during when receiving the external data through the receiving data control circuit or transmitting the internal data by turning on and off the second switch, the first switch keeps on.

8. The power chip of claim 7, wherein the second switch is turned on to pull down the multi-function pin to provide the indicating signal.

9. The power chip of claim 5, wherein the first switch is turned off when a discrete regulating resistor is coupled between the multi-function pin and a power supply.

10. The power chip of claim 1, further comprising a power-on detecting circuit, configured to receive the power-on signal and the power-on voltage threshold, and to provide a power-on enabling signal based on a comparison result of the power-on signal and the power-on voltage threshold.

11. The power chip of claim 1, wherein the multi-function pin is coupled to a host controller, the indicator enabling signal and the communication enabling signal are set by the external data from the host controller.

12. The power chip of claim 1, further comprising the switching converter, having:

an input terminal, configured to receive the input voltage; and an output terminal, configured to generate a load voltage based on the input voltage.

13. The power chip of claim 1, further comprising a PFC (Power Factor Correction) circuit and a resonance conversion circuit, wherein:

the PFC circuit is configured to receive an AC (Alternating Current) voltage, and to provide the input voltage based on the AC voltage; and the resonance conversion circuit is configured to receive the input voltage, and to provide a load voltage.

14. The power chip of claim 13, wherein the indicating signal generating circuit comprises:

an under-voltage detecting circuit, configured to receive a correction feedback signal indicative of the AC voltage and a under-voltage threshold, and to provide an under-voltage signal based on a comparison result of the correction feedback signal and the under-voltage threshold;

an over-voltage detecting circuit, configured to receive an input feedback signal indicative of the input voltage and an over-voltage threshold, and to provide an over-power signal based on a comparison result of the input feedback signal and the over-voltage threshold; and wherein the indicating signal is generated based on a logic operation result of the under-voltage signal and the over-power signal.

15. A power system, comprising:

a power chip, having a multi-function pin configured to provide an indicating signal and to receive/transmit a communication data based on a power-on signal indicative of an input voltage, wherein the communication data includes an internal data and an external data; and a transmitting circuit, having a first terminal coupled to the multi-function pin, a second terminal coupled to a post-stage circuit, and a third terminal coupled to a receiving terminal of a host controller; wherein the transmitting circuit (1) provides the indicating signal from the multi-function pin to the post-stage circuit; (2) transmits the internal data from the multi-function pin to the host controller.

16. The power system of claim 15, further comprising a receiving circuit, having a first terminal coupled to the multi-function pin and a second terminal coupled to a transmitting terminal of the host controller, wherein the receiving circuit transmits the external data from the host controller to the multi-function pin.

17. The power system of claim 15, wherein the power chip comprises:

a first switch;

a pull-up resistor, coupled in series with the first switch between a logic power supply and the multi-function pin;

a second switch, coupled between the multi-function pin and a power chip reference ground; and a receiving data control circuit, coupled between the multi-function and a receiving terminal of a communicating circuit of the power chip.

18. A control method of a power chip with a multi-function pin, comprising:

generating an indicating signal based on working states of a switching converter; and generating a power-on signal based on a power-on signal indicative of an input voltage of the switching converter and a power-on threshold;

wherein when the power-on signal is larger than the power-on voltage threshold, based on a logic operation result of a communication enabling signal and an indicator enabling signal, the multi-function pin performs one of functions of: (1) providing the indicating signal; (2) receiving/transmitting the communication data; (3) providing the indicating signal, and receiving/transmitting the communication data.

19. The control method of claim 18, the power chip has a function of receiving/transmitting a communication data through the multi-function pin when the power-on signal is smaller than the power-on voltage threshold.

20. The control method of claim 18, wherein the power-on voltage threshold is set by communication data from a host controller.

* * * * *